US012680166B2

(12) United States Patent　　　(10) Patent No.:　US 12,680,166 B2
Eickelkamp　　　　　　　　　　　　(45) Date of Patent:　　Jul. 14, 2026

(54) GAS INLET DEVICE FOR A CVD REACTOR

(71) Applicant: AIXTRON SE, Herzogenrath (DE)

(72) Inventor: Martin Eickelkamp, Würselen (DE)

(73) Assignee: AIXTRON SE, Herzogenrath (DE)

( * ) Notice: Subject to any disclaimer, the term of this patent is extended or adjusted under 35 U.S.C. 154(b) by 406 days.

(21) Appl. No.: 17/779,442

(22) PCT Filed: Dec. 1, 2020

(86) PCT No.: PCT/EP2020/084104
　§ 371 (c)(1),
　(2) Date: May 24, 2022

(87) PCT Pub. No.: WO2021/110670
　PCT Pub. Date: Jun. 10, 2021

(65) Prior Publication Data
　US 2023/0002902 A1　　Jan. 5, 2023

(30) Foreign Application Priority Data

Dec. 4, 2019　(DE) .................... 10 2019 133 023.8

(51) Int. Cl.
　*C23C 16/455*　　(2006.01)
　*C23C 16/458*　　(2006.01)
(52) U.S. Cl.
　CPC .. *C23C 16/45576* (2013.01); *C23C 16/45574* (2013.01); *C23C 16/4584* (2013.01)
(58) Field of Classification Search
　None
　See application file for complete search history.

(56) References Cited

U.S. PATENT DOCUMENTS

2006/0137607 A1 * 6/2006 Seo ..................... H01J 37/3244
　　　　　　　　　　　　　　257/E21.295
2007/0247075 A1 * 10/2007 Kim ..................... H01J 37/321
　　　　　　　　　　　　　　315/111.21

(Continued)

FOREIGN PATENT DOCUMENTS

DE　　　10 247 921 A1　　4/2004
DE　　10 2005 055 468 A1　　5/2007

(Continued)

OTHER PUBLICATIONS

International Search Report mailed Mar. 19, 2021, from the ISA/ European Patent Office, for International Patent Application No. PCT/EP2020/084104 (filed Dec. 1, 2020), 8 pgs.

(Continued)

*Primary Examiner* — Jeffrie R Lund
*Assistant Examiner* — Tiffany Z Nuckols
(74) *Attorney, Agent, or Firm* — Ascenda Law Group, PC

(57)　　　　　　ABSTRACT

A gas distribution device has a plurality of gas inlet regions that are arranged above each other and can be adjusted by switching on or off respective valves. The gas inlet regions can also be adjusted by switching over one or more feed conduits through which process gases can be fed into respective gas distribution volumes of gas outlet zones. The respective gas distribution volumes are arranged above each other at several levels. Only one uniform process gas can exit into a process chamber through each of the gas inlet regions.

6 Claims, 9 Drawing Sheets

(56) References Cited

U.S. PATENT DOCUMENTS

| | | | | | |
|---|---|---|---|---|---|
| 2010/0263588 | A1* | 10/2010 | Zhiyin | .................... | C30B 25/14 |
| | | | | | 118/724 |
| 2011/0294283 | A1* | 12/2011 | Brien | ................ | C23C 16/45508 |
| | | | | | 118/725 |
| 2012/0231609 | A1 | 9/2012 | Sato | | |
| 2016/0083844 | A1* | 3/2016 | Nishitani | .......... | C23C 16/45574 |
| | | | | | 239/548 |
| 2016/0111258 | A1* | 4/2016 | Taskar | .............. | C23C 16/45561 |
| | | | | | 118/723 VE |
| 2016/0273105 | A1* | 9/2016 | de Ridder | ......... | C23C 16/45565 |
| 2019/0226082 | A1* | 7/2019 | Kollberg | ............. | C23C 16/4405 |
| 2020/0149168 | A1* | 5/2020 | Honma | ............. | C23C 16/45561 |

FOREIGN PATENT DOCUMENTS

| | | | |
|---|---|---|---|
| DE | 10 2008 055 582 A1 | 6/2010 | |
| DE | 10 2011 002 145 A1 | 10/2012 | |
| DE | 10 2014 104 218 A1 | 10/2015 | |

OTHER PUBLICATIONS

Written Opinion mailed Mar. 19, 2021, from the ISA/European Patent Office, for International Patent Application No. PCT/EP2020/084104 (filed Dec. 1, 2020), 7 pgs.
International Preliminary Report on Patentability, from the International Bureau of WIPO, for International Patent Application No. PCT/EP2020/084104 (filed Dec. 1, 2020), 16 pgs.
Written Opinion mailed Mar. 19, 2021, from the ISA/European Patent Office, for International Patent Application No. PCT/EP2020/084104 (filed Dec. 1, 2020), English translation, 7 pgs.

* cited by examiner

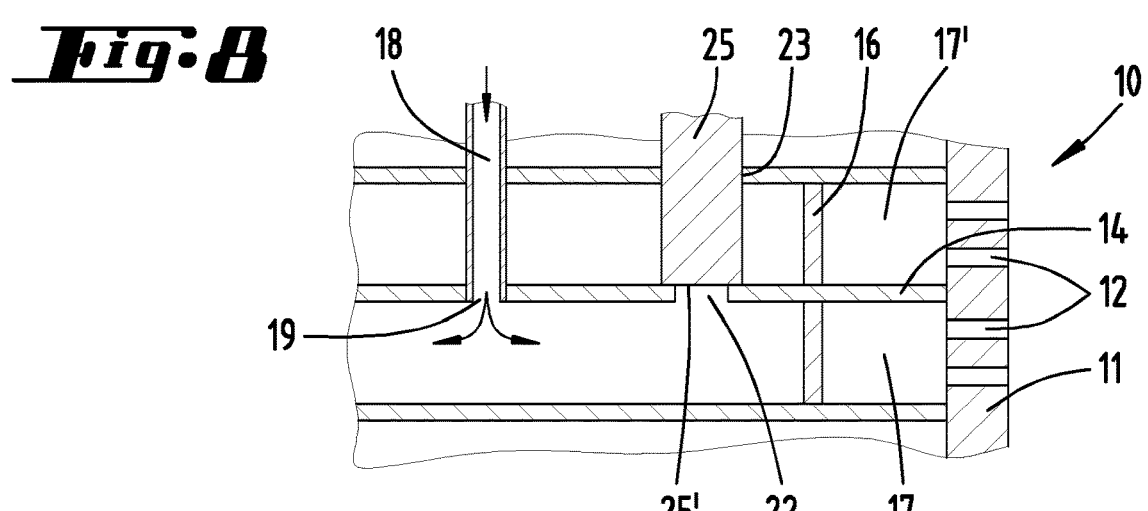
*Fig·8*
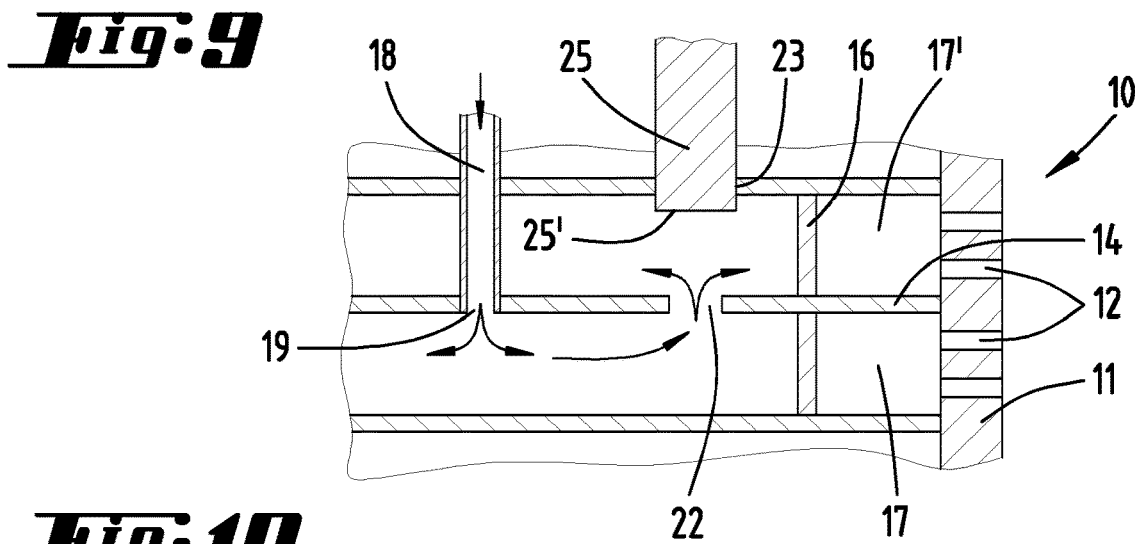
*Fig·9*
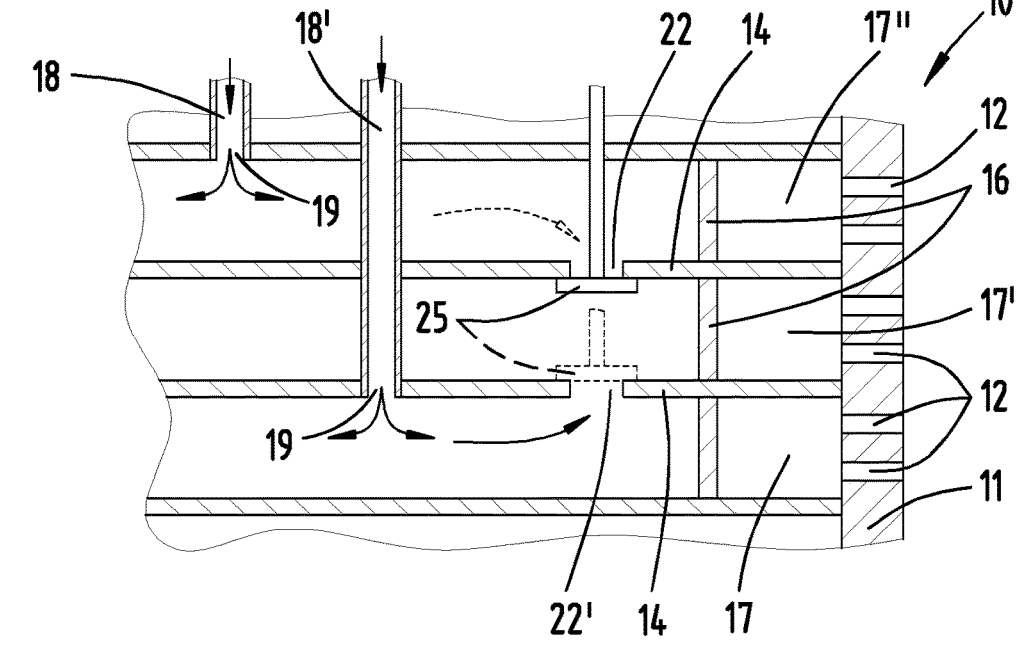
*Fig·10*

Fig·11
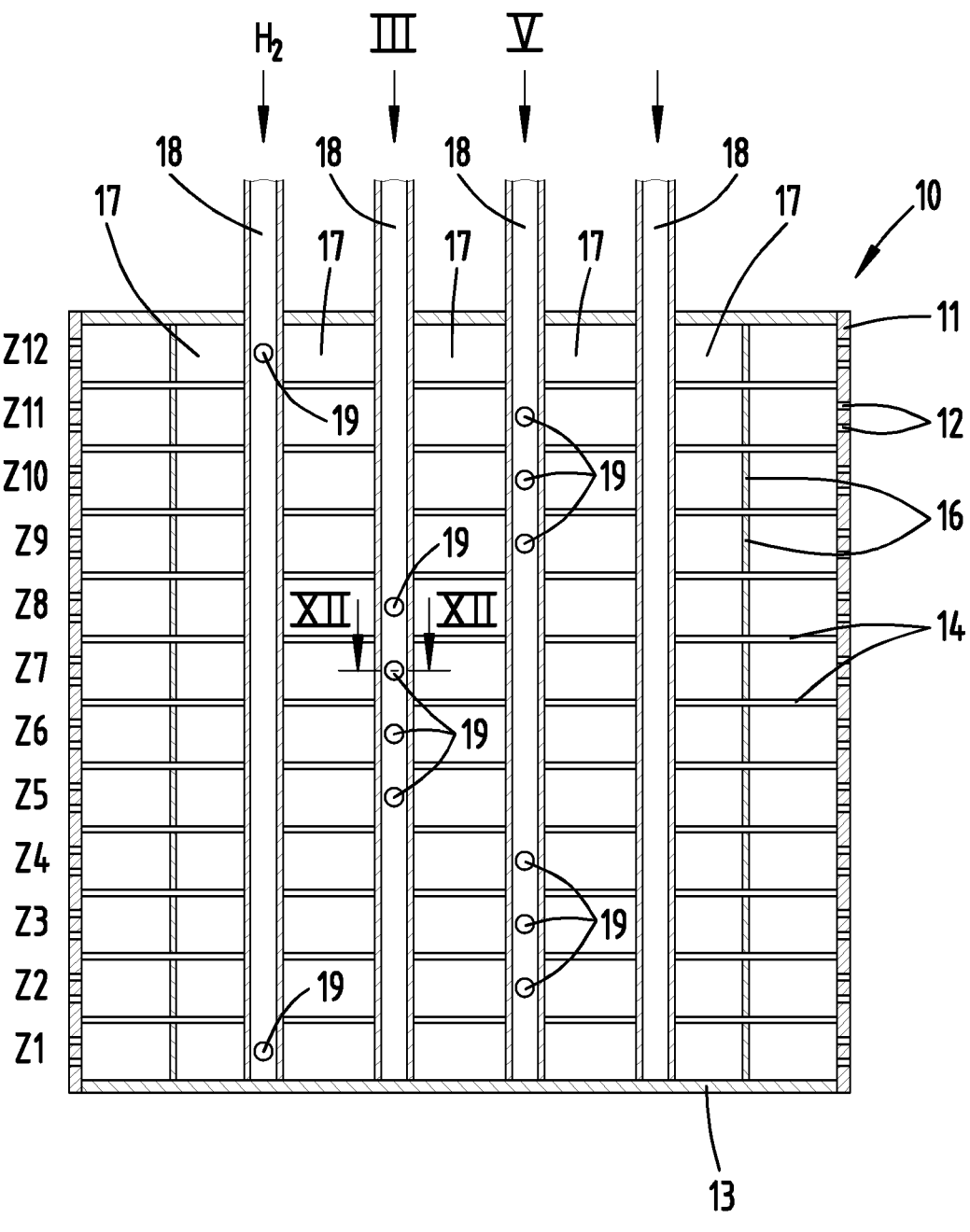

GAS INLET DEVICE FOR A CVD REACTOR

RELATED APPLICATIONS

This application is a National Stage under 35 USC 371 of and claims priority to International Application No. PCT/EP2020/084104, filed 1 Dec. 2020, which claims the priority benefit of DE Application No. 10 2019 133 023.8, filed 4 Dec. 2019.

FIELD OF THE INVENTION

The invention relates to a gas inlet device for a CVD reactor with multiple gas inlet regions that are arranged on top of one another and respectively have gas outlet openings, through which a process gas is fed into a process chamber of a CVD reactor. Only one process gas is respectively introduced into the process chamber through each gas inlet region.

The invention furthermore relates to a CVD reactor equipped with such a gas inlet device and to a method for feeding process gases into a process chamber.

BACKGROUND

DE 10 2008 055 582 A1 and DE 10 2014 104 218 A1 describe a gas inlet device with multiple gas outlet zones that are arranged vertically on top of one another, wherein said gas outlet zones are arranged vertically on top of one another and respectively connected to a gas source via a supply conduit.

Gas inlet devices, the gas outlet zones of which are arranged vertically on top of one another and have different heights, are used for carrying out various processes for depositing different layers, particularly layers consisting of multiple components, especially Group III-V components.

SUMMARY OF THE INVENTION

The invention is based on the objective of disclosing a method for feeding a process gas into a CVD reactor and thereby enhancing a CVD reactor and, in particular, the associated gas mixing system.

This objective is attained with the invention specified in the claims, wherein the dependent claims not only represent advantageous enhancements of the independent claims, but rather also independent solutions of the objective.

The invention proposes measures, by means of which a different process gas can be selectively fed into at least one of the gas distribution volumes. A gas inlet device usually has three to five gas inlet regions that are arranged on top of one another. A hydride of a Group III compound such as arsine, phosphine or ammonia can be fed into the process chamber together with a carrier gas, e.g. hydrogen, through an uppermost and a lowermost gas inlet region. An organometallic compound, particularly a Group III MO-compound, likewise can be fed into the process chamber together with a carrier gas through an intermediate central gas inlet region. The Group III compound and the Group V compound can decompose on the heated surface of a susceptor. The decomposition products can be deposited on a substrate arranged in the process chamber so as to form a Group III-V layer. According to the invention, multiple gas distribution volumes, particularly multiple directly adjacent gas distribution volumes, can be interconnected into a gas inlet region, through which the same process gas can flow into the process chamber, in different processes. This makes it possible to vary the height of the gas inlet regions, through which the same process gas flows into the process chamber. An inert gas also can be discharged through an uppermost gas outlet zone and/or through a lowermost gas outlet zone, i.e. through a gas outlet zone lying directly adjacent to a process chamber ceiling or a susceptor, during a deposition process in order to protect the surface of the susceptor and/or the surface of the process chamber ceiling against parasitic deposition. It is particularly proposed that each gas inlet region, through which the same process gas flows, is formed by at least one gas outlet zone, preferably by two gas outlet zones. An inventive gas inlet device preferably can have at least five, seven, nine, ten or twelve gas distribution volumes that are respectively separated from one another by a base, wherein each gas distribution volume forms a gas outlet zone and multiple gas outlet zones are interconnected into a gas inlet region for introducing the same process gas. In this context, it is particularly proposed that multiple gas distribution volumes are interconnected in different combinations. According to one variation of the invention, it is proposed that an individually assigned supply conduit leads into each gas distribution volume. In this case, the supply conduit may have a single mouth that opens into the gas distribution volume. A gas conduit may lead into each of the supply conduits. The gas conduits can be selectively connected to one of a plurality of feed conduits by means of multiple valves that can be opened and closed. A different gas such as an inert gas or one of the process gases can be fed into each feed conduit. Consequently, the process gas can be fed into a different combination of gas distribution volumes and therefore exit from different combinations of gas outlet zones by switching the respective valves accordingly. The respective plurality of gas outlet zones or gas distribution volumes can be divided into multiple groups. For example, one group may comprise a plurality of gas outlet zones bordering on the process chamber bottom and/or a plurality of gas outlet zones bordering on the process chamber ceiling. A second group may comprise, for example, a plurality of gas outlet zones arranged in the center of the process chamber. A group of gas outlet zones may respectively form a gas inlet region, wherein the gas outlet zones belonging to a group directly border on one another and the same process gas or inert gas respectively exits into the process chamber through the gas outlet zones of the same group. Two adjacent groups, through the gas outlet zones of which a different gas respectively exits into the process chamber, border on one another in such a way that the gas outlet zones arranged at the border can be selectively assigned to either of the two groups, which border on one another at the border, by switching over the valves accordingly. In this case, gas outlet zones can be assigned to a border region and the gas conduits, which are assigned to the gas outlet zones assigned to a respective border region, can be selectively connected to different feed conduits. However, gas conduits of gas outlet zones that are arranged outside a border region, i.e. not assigned to any border region, may only be connected to one feed conduit. This makes it possible to selectively assign gas outlet zones arranged in a border region to either of the two groups bordering on one another in the border region. Consequently, these gas outlet zones can be used for increasing or reducing the size of a gas inlet region for respectively introducing the same process gas. The height of the gas inlet region therefore can be increased or reduced by switching over respective valves, by means of which feed conduits are connected to gas conduits. The switchover elements in the form of valves may be arranged outside the gas inlet device and, in particular, outside the reactor. The switchover elements form part of a gas mixing system in this case. However, the switchover elements may alternatively also be arranged in the reactor and, in particular, in the gas inlet device. According to one variation of the invention, it is proposed that the supply conduits are formed by pipes. The pipes have openings that lead into a gas distribution volume. In this variation, the pipes can be displaced in such a way that their openings selectively lead into different gas distribution volumes. This can be realized by means of an axial displacement of a pipe or by means of a rotation of a pipe. It would be possible to provide stops, on which the pipe respectively abuts when the entire opening leads into a gas distribution volume. It would furthermore be possible to provide openings, which can be selectively opened or closed by means of a closing element, between two gas distribution volumes such that a process gas fed into one of the two gas distribution volumes can flow into another gas distribution volume through the opening. A supply conduit in the form of a pipe may also have multiple openings, which can be closed by displacing the pipe, e.g. by rotating or linearly moving the pipe, in an outer pipe. In an arrangement of this type, in which the switchover elements are arranged in the gas inlet device, a supply conduit can selectively lead into different gas distribution volumes. A supply conduit also can simultaneously lead into multiple gas distribution volumes. However, it would also be possible that no supply conduit that is connected to a gas conduit leads into a gas distribution volume at all, but that the gas distribution volume rather can be selectively connected to an adjacent gas distribution volume in a fluidic manner by closing or opening a passage opening. To this end, it is preferred to provide mechanical actuating elements that can be actuated from outside the reactor or the gas inlet device and make it possible to spatially displace supply conduit pipes or closing elements.

BRIEF DESCRIPTION OF THE DRAWINGS

Exemplary embodiments of the invention are described below with reference to the attached drawings. In these drawings:

FIG. 8 shows a sixth exemplary embodiment in a first position, in which a closing element 25 closes an opening 22 in a base 14 between an upper gas distribution volume 17' and a lower gas distribution volume 17, FIG. 9 shows the sixth exemplary embodiment in a second position, in which the opening 22 is open, FIG. 10 shows a seventh exemplary embodiment, in which two openings 22, 22' in bases 14 of adjacent gas distribution volumes 17", 17' can be selectively closed by vertically lifting a closing element 25, FIG. 11 shows an eighth exemplary embodiment, in which gas outlet openings 19 can be opened or closed by means of a rotation.

DETAILED DESCRIPTION

Figure 1:
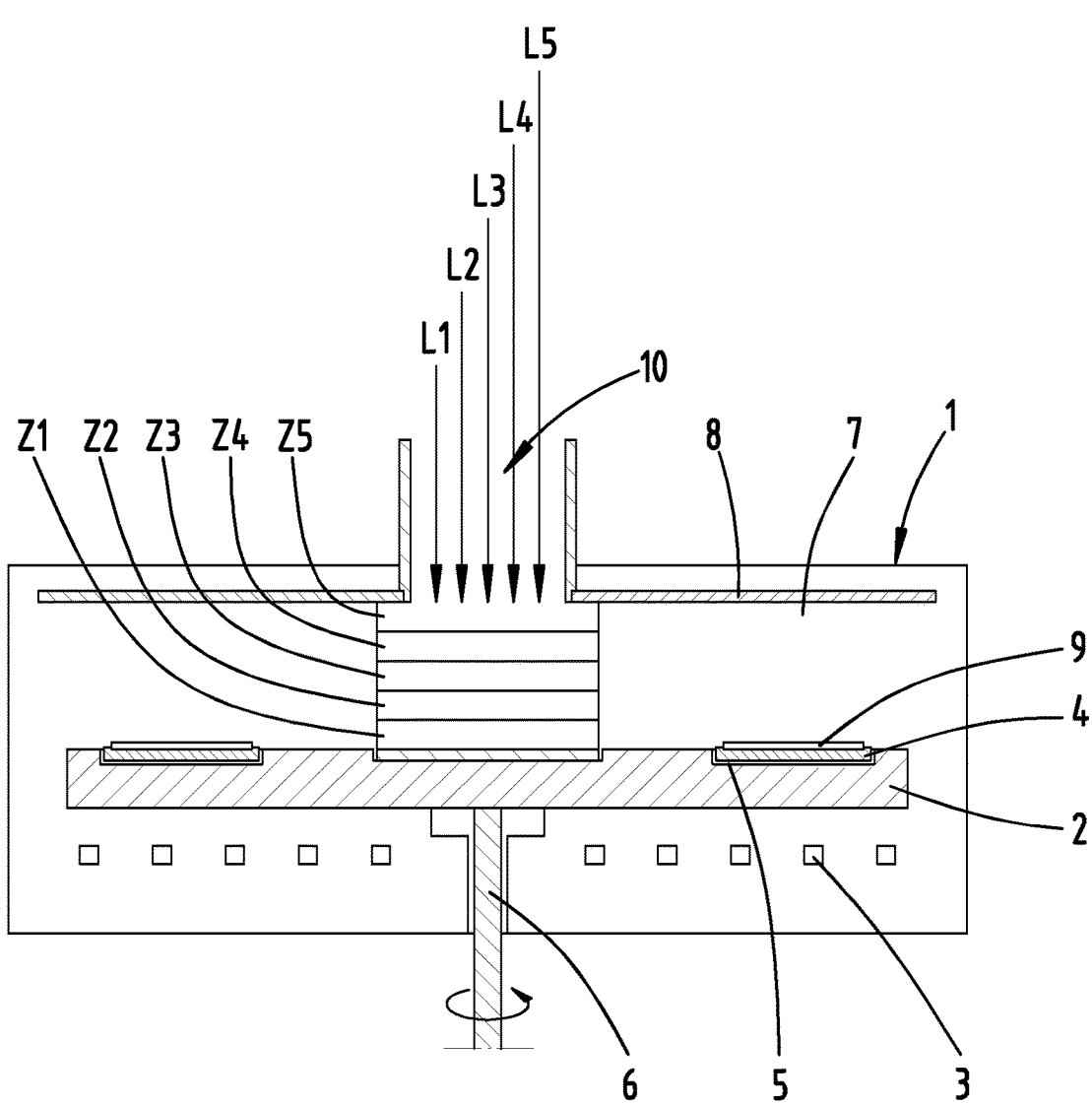
FIG. 1 schematically shows a CVD reactor having a gas inlet device 10 with five gas outlet zones Z1 to Z5 that are arranged on top of one another, wherein each of the gas outlet zones Z1 to Z5 is individually connected to a supply conduit and a gas conduit L1 to L5, and wherein the gas conduits L1 to L5 can be selectively connected to feed conduits G1 to G4 in a fluidic manner as described in the following figures, FIG. 2 schematically shows a first exemplary embodiment of a gas inlet device 10 with twelve gas outlet zones Z1 to Z12 that are arranged on top of one another, wherein a region of a gas mixing system, in which gas conduits L1 to L12 can be selectively connected to feed conduits G1 to G4 by means of valves 20, is schematically illustrated above the gas inlet device 10, and wherein the clear circles represent closed valves and the filled circles represent open valves such that three gas inlet regions E1 to E3 are formed in this exemplary embodiment, FIG. 3 schematically shows a second exemplary embodiment in the form of a representation according to FIG. 2, wherein the gas outlet regions E1 to E3 differ with respect to the connectability to gas conduits, FIG. 4 schematically shows a third exemplary embodiment with five gas outlet regions E1 to E5 in the form of a representation according to FIG. 2.

The exemplary embodiments concern gas inlet devices with at least five, seven, nine, eleven or twelve gas outlet zones Z1 to Z12, which are arranged vertically on top of one another and into which different gases, particularly process gases or inert gases, can be selectively fed. A gas inlet device 10 can be used, for example, in a CVD reactor of the type schematically illustrated in FIG. 1. The CVD reactor has a gas-tight reactor housing 1. A susceptor 2, which particularly is made of graphite, is located within the reactor housing 1 and carries one or more substrates 9 that should be coated with one or more layers, particularly III-V-layers, in a process chamber 7 of the CVD reactor. To this end, the susceptor 2 is heated from below by means of a heating apparatus 3, particularly an RF heater. The susceptor 2 can be rotationally driven about an axis by means of a rotatable shaft 6. The susceptor 2 defines the lower extent of the process chamber 7, whereas a process chamber ceiling 8 defines the upper extent of the process chamber 7. In the exemplary embodiment, the susceptor 2 has pockets that are open toward the process chamber 7, wherein a substrate holder 4 capable of carrying one or more substrates 9 is respectively arranged in said pockets. A flushing gas, which rotates the substrate holder in a floating manner, can be fed into the pocket 5 by means of flushing gas conduits (not shown). A gas inlet device 10 of the type illustrated in the drawings is located in the center of the process chamber 7.

Figure 2:
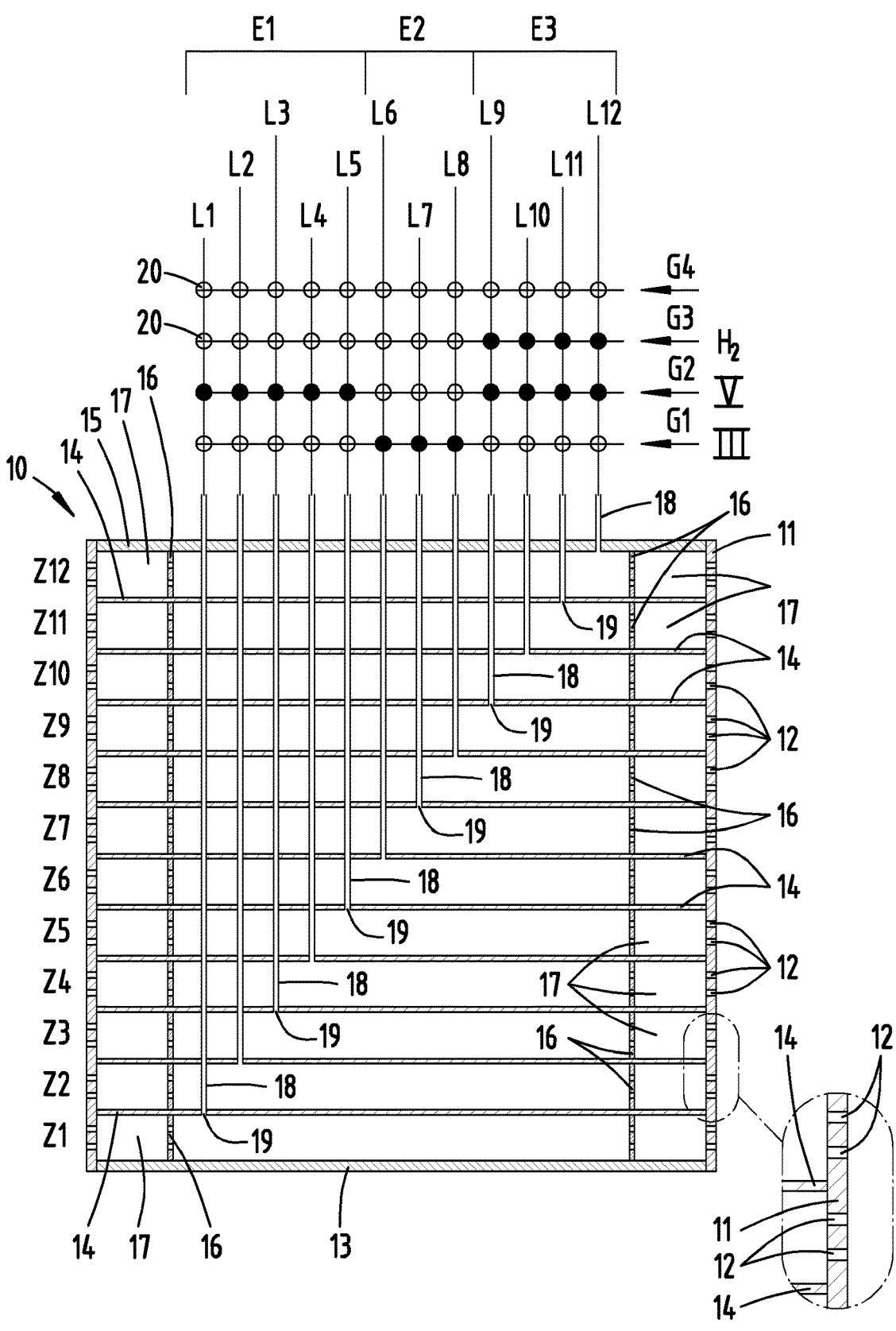

The gas inlet device 10 illustrated in FIG. 2 has twelve gas outlet zones Z1 to Z12 that are arranged on top of one another, wherein each of the gas outlet zones has the same height. However, the gas outlet zones Z1 to Z12 can have different heights. A bottom 13 defines a lower extent of the lowermost gas outlet zone Z1 and a base 14 of an adjacent gas outlet zone Z2 defines an upper extent of the lowermost gas outlet zone Z1. Additional gas outlet zones Z3 to Z12, which are respectively separated from one another by a base 14, are arranged above the gas outlet zone Z2. The upper-most gas outlet zone Z12 has a ceiling 15.

Each of the gas outlet zones has a circumferentially enclosed chamber that is separated from the parallel bases 14 and forms a gas distribution volume 17. The gas distribution volume 17 is delimited by a gas outlet wall 11 that extends on a cylinder shell surface. The gas outlet wall 11 has a plurality of gas outlet openings 12, through which gas fed into the gas distribution volume 17 can exit in the radial direction referred to an axis of the gas inlet device 10.

A plurality of supply conduits 18 is provided. These supply conduits may be formed by pipes. Each supply conduit 18 has a mouth 19 that opens into a gas distribution volume 17. The supply conduits 18 lead into the gas distribution volume 17 in a central region. The central region of the gas volume 17 is surrounded by a pressure barrier 16 in order to achieve a uniform discharge of the process gas in the azimuthal direction. The pressure barrier 16 may be formed on a wall that extends on a circular arc line parallel to the gas outlet wall 11.

Each of the supply conduits 18 is connected to a gas conduit L1 to L12. The gas conduits L1 to L12 are assigned to a gas mixing system. This gas mixing system is schematically illustrated in FIG. 2. In this case, the parallel gas conduits L1 to L12 intersect four feed conduits G1 to G4. Closed valves are illustrated in the form of clear circles and open valves are illustrated in the form of filled circles at the intersecting points and connect the gas conduits L1 to L12 to the feed conduits G1 to G4 at the intersecting points. In the exemplary embodiment, each gas conduit L1 to L12 is connected to each of the feed conduits G1 to G4 by means of a valve such that each of the process gases or inert gases can be fed into the respective gas distribution volumes 17. In the exemplary embodiment illustrated in FIG. 2, the feed conduit G3 may be supplied with a carrier gas such as $H_2$, $N_2$ or Ar. The feed conduit G2 may be supplied with ammonia or another hydride. The feed conduit G1 may be supplied with trimethylaluminium or with another organo-metallic Group III compound.

The valves 20 are switched in such a way that three gas inlet regions E1, E2, E3 are formed. A first gas inlet region E1 is formed by the gas outlet zones Z1 to Z5. A Group V compound flows into the process chamber through the gas outlet openings of this gas inlet region E1. A second gas inlet region E2 is formed by the gas outlet zones Z6 to Z8. A Group III compound flows into the process chamber through the gas outlet openings 12 assigned to this gas inlet region E2. The gas outlet zones Z9 to Z12 form a third gas inlet region E3, through which a Group V compound likewise flows into the process chamber. Hydrogen is additionally fed into the third gas inlet region E3 in this case.

The size of the gas inlet region E1 can be reduced and the size of the gas inlet region E2 can be increased by changing the valve position, e.g., of the valve connecting the feed conduit G2 to the gas conduit L5. An inert gas can be fed into the gas outlet zone Z1 by changing the valve position of the respective valves 20 in the intersecting point between the feed conduit G2 and the gas conduit L1 and in the intersecting point between the feed conduit G3 and the gas conduit L1. It is possible to only feed an inert gas into the gas outlet zone Z12 by changing the valve position of the valve 20 in the intersecting point between the gas conduit L12 and the feed conduit G2. The opened valves at the intersecting points between the feed conduit G3 and the gas conduits L9, L10, L11 and L12 cause a dilution of the process gas fed into the gas inlet region E3. The diluting effect can be canceled by closing these valves.

Figure 3:
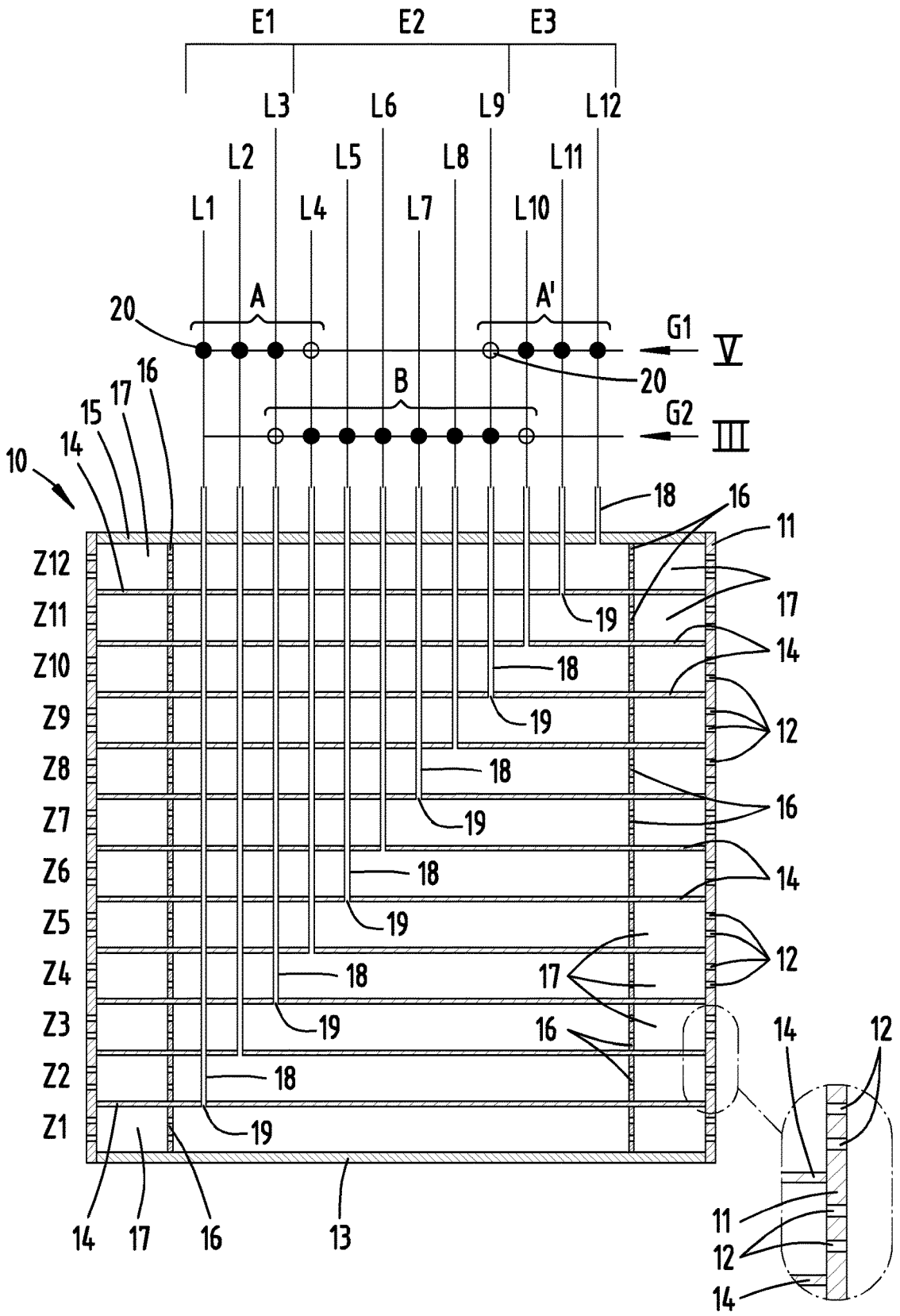

The exemplary embodiment illustrated in FIG. 3 essentially differs from the exemplary embodiment illustrated in FIG. 2 in that a first group A, A' of gas conduits L1 to L4 or L9 to L12 respectively can be selectively connected to only the feed conduit G1 and a second group B of gas conduits L3 to L10 can be selectively connected to the feed conduit G2. It is important that the gas conduits L3, L4 and L9, L10 belong to the first group A, as well as to the second group B, such that a Group III compound or a Group V compound can be selectively introduced through these gas conduits L3, L4, L9, L10. The size of a gas inlet region E2, through which a Group III compound is introduced into the process chamber, or the size of the two gas inlet regions E1, E2, through which a Group V compound is introduced into the process chamber, therefore can be increased or reduced by switching over the corresponding valves. This is realized by simply switching over respective valves.

However, the exemplary embodiment illustrated in FIG. 3 may also be provided with additional feed conduits, by means of which an inert gas can be fed into the gas conduits L1 to L12 at different intersecting points (valves). The heights of the gas inlet regions E1 and E2 can be varied with the valves arranged at the intersecting points L3/G1, L4/G1, L3/G2 and L4/G2. The heights of the gas inlet regions E2 and E3 can be varied with the valves 20 arranged at the intersecting points L9/G1, L9/G2, L10/G1 and L10/G2.

Figure 4:
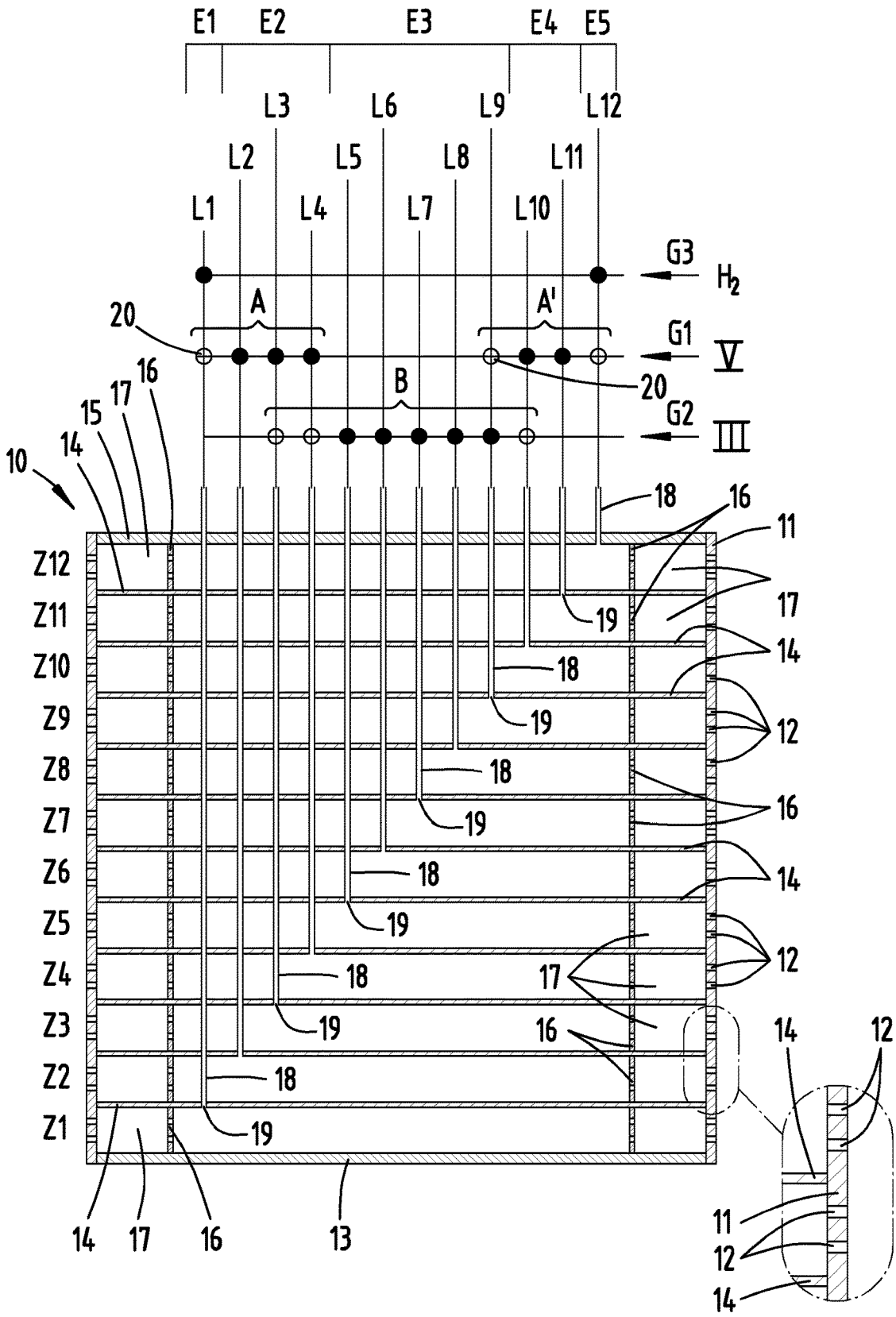

The exemplary embodiment illustrated in FIG. 4 essentially differs from the respective exemplary embodiment illustrated in FIG. 2 or FIG. 3 in that $H_2$ can be additionally fed into the uppermost or lowermost gas outlet zone Z1 or Z12 by means of a feed conduit G3. In this case, no process gas of the Group III compound or the Group V compound is respectively fed into the lowermost gas outlet zone Z1 or the uppermost gas outlet zone Z12.

Five gas inlet regions E1, E2, E3, E4, E5 are provided in this case, wherein the gas inlet region E1 has only a single gas outlet zone Z1, into which hydrogen is fed. The gas inlet region E5 also has only a single gas outlet zone Z12, through which hydrogen is fed into the process chamber 7. The gas inlet region E2 has three gas outlet zones Z2 to Z4, but its size can be reduced to one gas outlet zone Z2 or increased to four gas outlet zones Z1 to Z4 by changing the position of the respective valves. The gas inlet region E3 can have no more than eight gas outlet zones Z3 to Z10. In the valve position according to FIG. 4, however, the gas inlet region E3 has only five gas outlet zones Z5 to Z9. The gas inlet region E4 can have no more than four gas outlet zones Z9 to Z12. In the exemplary embodiment, however, the respective valves are switched in such a way that the gas inlet region E4 has only two gas outlet zones Z10, Z11. The corresponding gas inlet device has gas outlet zones Z1 to Z12 with a uniform height such that gas inlet regions with different height can be adjusted by switching the respective valves. This may take place during a deposition process, e.g. when changing process gases for depositing qualitatively different layers.

Figure 5:
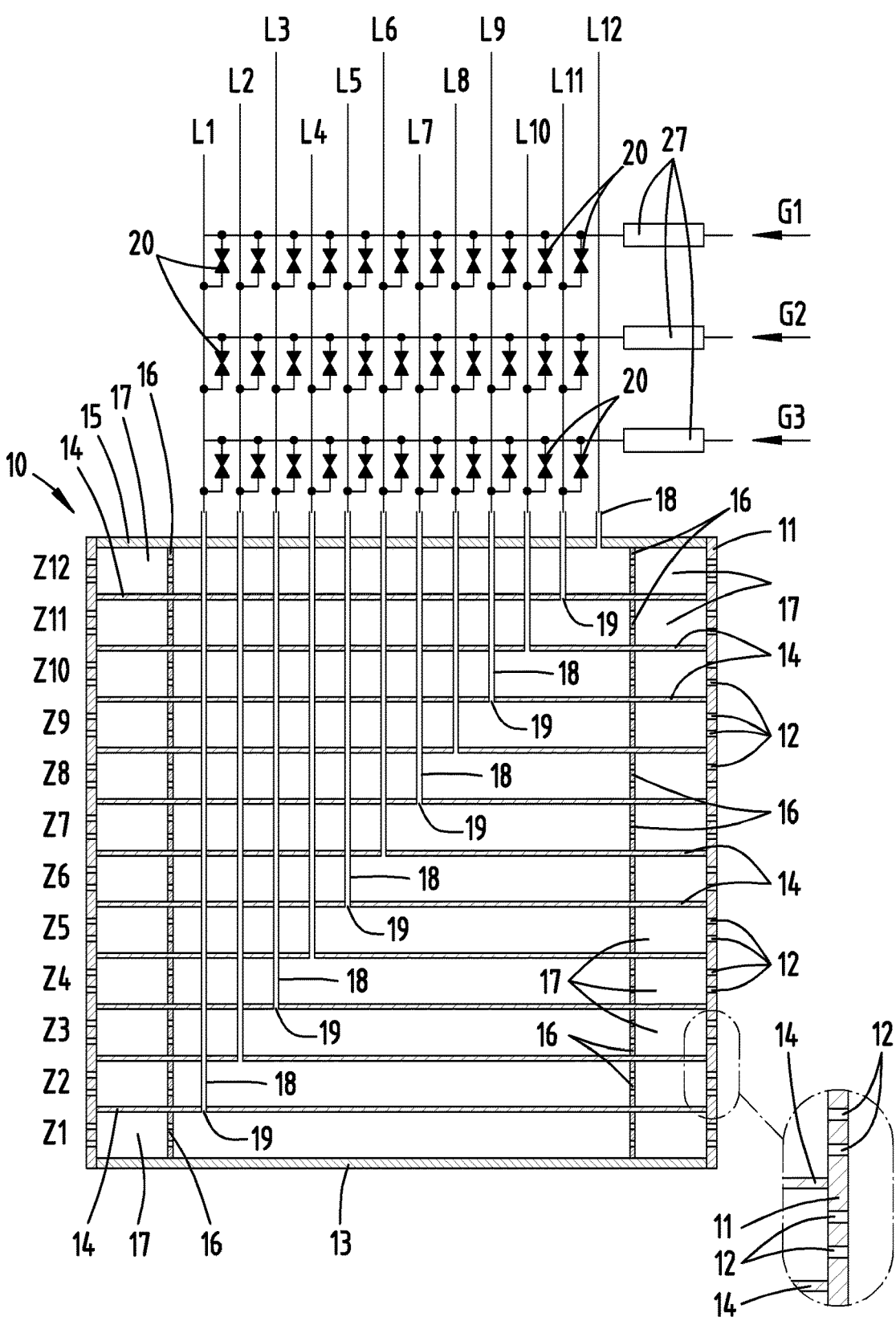
FIG. 5 shows a fourth exemplary embodiment of the invention in the form of a modified representation of the gas mixing system, in which mass flow controllers 27 are provided for the valves 20 so as to adjust a mass flow of a process gas or an inert gas to the valves 20.

FIG. 5 schematically shows an example of a gas mixing device for realizing the above-described exemplary embodiments. A gas flow originating from a gas source is fed into one of the feed conduits G1, G2, G3. The mass flow of the gas is controlled by means of a mass flow controller 27. The mass flow can be divided over different gas outlet zones Z1 to Z12 with valves 20. To this end, the valves connect the feed conduits G1 to G3 to the gas conduits L1 to L12, which respectively lead into a supply conduit 18 that in turn leads into a gas distribution volume 17 with a mouth opening 19.

The number and the height of a plurality of gas inlet regions E1 to E5 can also be varied in this case by changing the position of the respective valves 20, wherein each gas inlet region E1 to E5 is characterized in that the same process gas flows into the process chamber through all gas outlet zones Z1 to Z12 assigned to the respective gas inlet region, and in that all gas outlet zones Z1 to Z12 of a gas inlet region E1 to E5 border on one another, i.e. form a uniform, interconnected gas outlet surface. In the context of the invention, the height of a gas inlet region E1 to E5 refers to a section of a process chamber height extending perpendicular to the upper side of the susceptor 2. This section can be varied by switching over respective switchover elements, which may be realized in the form of valves.

Figure 6:
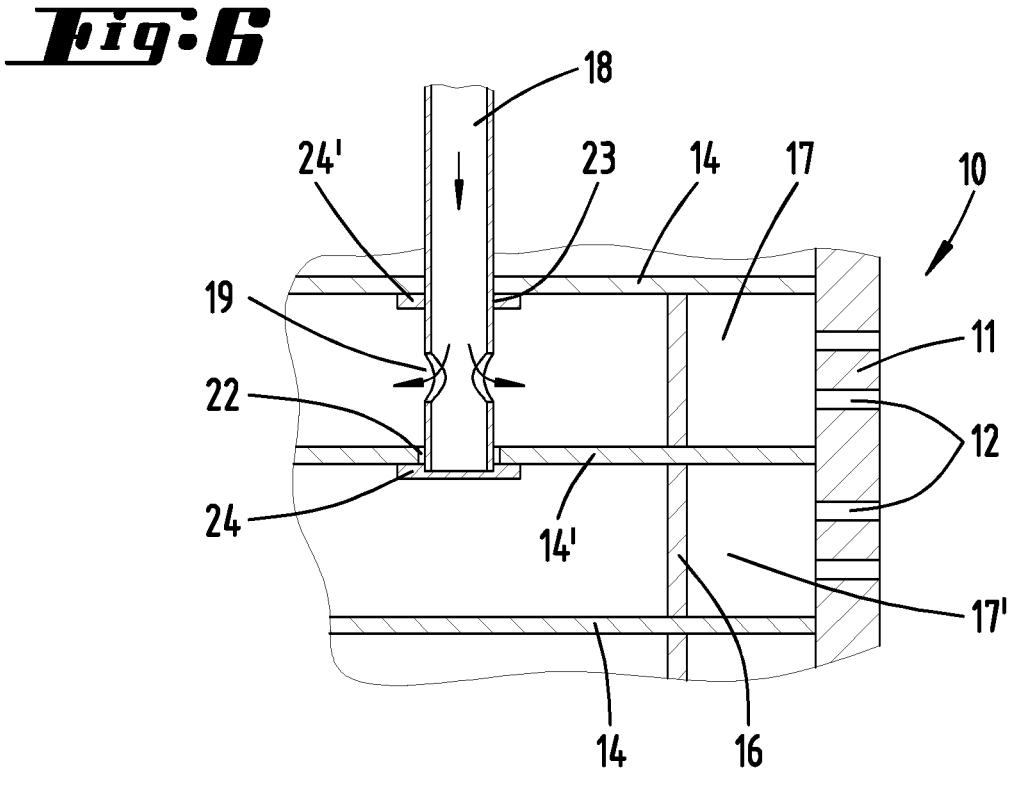
FIG. 6 shows a detail of a gas inlet device 10 according to a fifth exemplary embodiment in a first operating position, in which a mouth 19 of a supply conduit 18 opens into an upper gas distribution volume 17.
Figure 7:
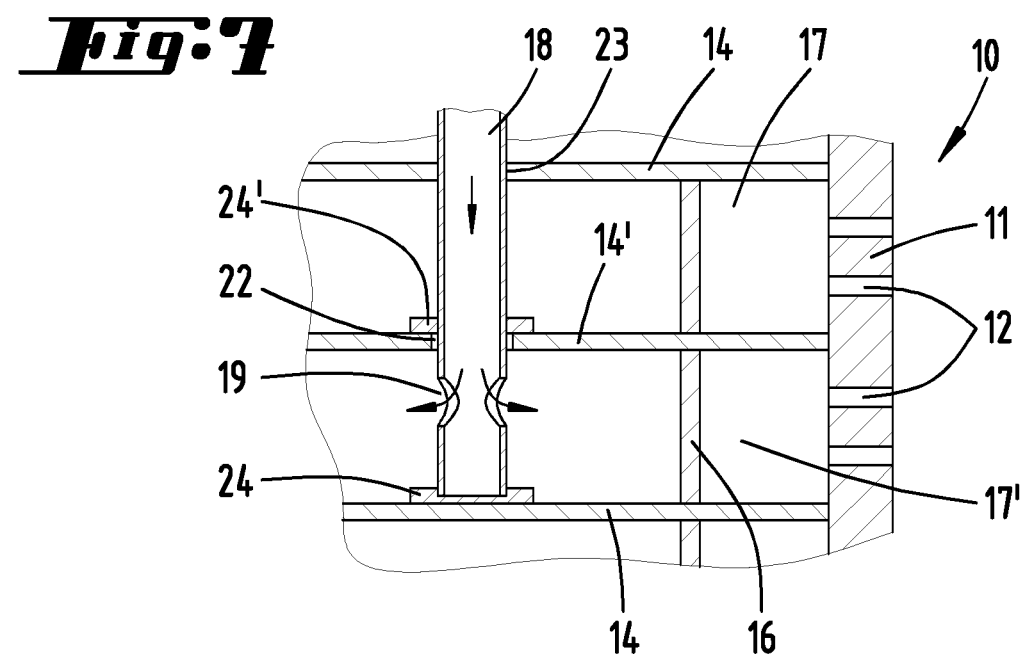
FIG. 7 shows a representation according to FIG. 6 in a second position, in which the mouth 19 opens into a lower gas distribution volume 17'.

The exemplary embodiment illustrated in FIGS. 6 and 7 shows a section of a gas inlet device 10. A supply conduit 18 in the form of a pipe can be displaced in the axial direction. The supply conduit 18 has stops 24, 24' that respectively contact a base 14, 14' in the two end positions illustrated in FIGS. 6 and 7. In the position illustrated in FIG. 6, a mouth 19 of the supply conduit 18 opens into an upper gas distribution volume 17. The mouth 19 of the supply conduit 18 opens into a subjacent gas volume 17' in the position illustrated in FIG. 7. The switchover process is carried out by using a mechanical switchover device (not shown), which displaces the supply conduit 18 through a bore 23 of the base 14. In this case, a process gas or an inert gas can be selectively fed into adjacent gas distribution volumes 17, 17' with the supply conduit 18.

In the exemplary embodiment illustrated in FIGS. 8 and 9, a supply conduit 18 leads into a lower gas distribution volume 17. No supply conduit 18 leads into the gas distribution volume 17' lying on top thereof. The base 14 between the two gas distribution volumes 17, 17' has an opening 22, which in the position illustrated in FIG. 8 is closed in a gas-tight manner by an end face 25' of a closing element 25. A mechanical switchover device (not shown) can displace the closing element 25 into the position illustrated in FIG. 9, in which the opening 22 is open, such that process gas can flow from the gas distribution volume 17 into the gas distribution volume 17'

Alternatively, a supply conduit 18 leading into the upper gas distribution volume 17' may also be provided such that mixing takes place through the opening 22. However, it would also be possible that a process gas only flows through one of the supply conduits 18 when the opening 22 is opened. In an exemplary embodiment (not shown), an additional gas distribution volume, into which a supply conduit 18 leads, may be provided above the gas distribution volume 17'. Another opening in a base between the volume 17' and the additional gas distribution volume can be opened or closed with an additional closing element similar to the closing element 25. Such an arrangement makes it possible to realize a changeover circuit, by means of which two of the three volumes can be respectively interconnected.

In the exemplary embodiment illustrated in FIG. 10, two gas distribution volumes 17, 17' that can be supplied with different process gases border on a gas distribution volume 17". The supply conduits 18, 18' lead into the gas distribution volumes 17", 17, respectively. The gas distribution volume 17' can be selectively connected to the upper gas distribution volume 17" or the lower gas distribution volume 17 in a fluidic manner with a closing element 25 that functions as a switchover valve. To this end, openings 22, 22' arranged in two adjacent bases 14 are aligned with one another, wherein the closing element 25 can move between said openings in order to respectively close one opening 22 while the other opening 22' is opened.

Analogous to the exemplary embodiment illustrated in FIGS. 8 and 9, the exemplary embodiment illustrated in FIG. 10 may be provided with mechanical actuating elements for mechanically displacing the closing element 25 or a shaft of the closing element 25, respectively.

Figure 12:
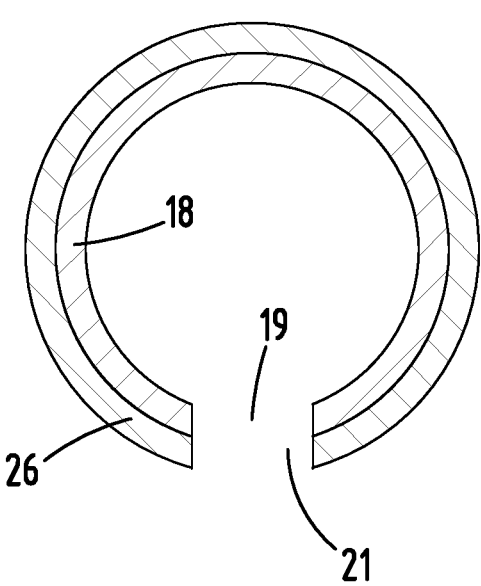
FIG. 12 shows a section along the line XII-XII in FIG. 11 in a first position.
Figure 13:
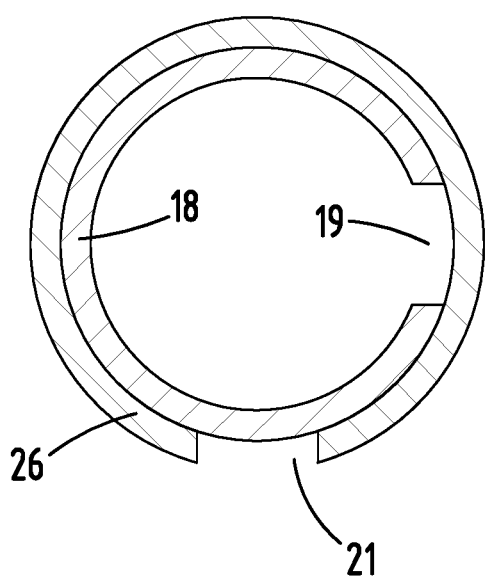
FIG. 13 shows the section according to FIG. 12 in a second position.

The exemplary embodiment illustrated in FIGS. 11 to 13 has a plurality of supply conduits 18 that preferably extend through the entire axial extent of the gas inlet device 10. The supply conduits 18 have one or more radial openings 19 that respectively lead into a gas outlet zone Z1 to Z12. The supply conduits 18 may be realized in the form of pipes that are rotatable about their axis and have openings 19 at different azimuthal positions. The openings 19 can be moved into an overlapping position with outlet openings 21 of an outer pipe 26 by rotating the pipes forming the supply conduit 18. To this end, the supply conduit 18 is arranged within an outer pipe (FIG. 12). The opening 19 is closed in another rotational position of the supply conduit (FIG. 13). Different process gases can be fed into the gas distribution volumes 17 by rotating or, alternatively, by axially displacing the pipes forming the supply conduits 18. Mechanical switchover devices may be provided for adjusting the supply conduits 18. However, it would alternatively also be possible to analogously rotate the outer pipes 26 such that the openings 19, 21 are either aligned with one another or respectively closed by walls of the other pipe 18, 26.

The exemplary embodiment illustrated in FIGS. 6 to 13 is provided with mechanical driving means (not shown), by means of which the switchover elements can be displaced in order to change the number of gas outlet zones of a gas inlet region and to thereby vary the height of the gas inlet regions.

A particular advantage of the invention can be seen in that the effective size of a gas outlet surface of a gas inlet region E1 to E5 can be varied by means of switchover elements arranged inside or outside a reactor housing. This is preferably realized by switching on, switching off or switching over one or more supply conduits 18, wherein said supply conduits preferably are switched on or off by means of respective valves 20 that may be arranged in a gas mixing system. The gas inlet regions E1 to E5 altogether form a gas outlet region, which extends on a cylinder shell wall and is formed by a plurality of preferably identical gas outlet zones Z1 to Z12. The gas outlet zones Z1 to Z12 can be combined into interconnected gas inlet regions E1 to E5 in different combinations. To this end, it is advantageous if individual supply conduits 18, which can be selectively connected to different feed conduits G1 to G4 in a fluidic manner, respectively lead into at least a few of the gas distribution volumes 17, namely into the gas distribution volumes that can be selectively assigned to different gas inlet regions E1 to E5.

The preceding explanations serve for elucidating all inventions that are included in this application and respectively enhance the prior art independently with at least the following combinations of characteristics, wherein two, multiple or all of these combinations of characteristics may also be combined with one another, namely:

A gas distribution device having multiple gas inlet regions E1 to E5, which are arranged on top of one another and from which different process gases or at least one carrier gas can be introduced into a process chamber 7 of a CVD reactor, with at least five gas outlet zones Z1 to Z12, which are arranged on top of one another at different levels and respectively have a gas distribution volume 17 that can be supplied with a gas flow, wherein said gas distribution volume is separated from an adjacent gas distribution volume 17' by an intermediate base 14 and has a gas outlet wall 11 with gas outlet openings 12, wherein the gas outlet walls 11 of the gas outlet zones Z1 to Z12 point in the same direction and multiple adjacent gas outlet walls 11 jointly form a gas inlet region E1 to E5, through which a uniform process gas respectively exits into the process chamber 7, and wherein the height of the gas inlet regions E1 to E5 can be adjusted by switching on, switching off or switching over one or more of the supply conduits 18, through which the process gases can be fed into the gas distribution volumes 17.

A gas distribution device, which is characterized in that each gas outlet zone Z1 to Z12 has a supply conduit that leads into the gas distribution volume 17, 17', wherein the supply conduit 18 can be connected to a feed conduit G1 to G4 for introducing a carrier gas or a process gas, and wherein adjacent gas outlet zones Z1 to Z12 are separated from one another by a base 14, 14', or in that at least a few of the gas outlet zones Z1 to Z12 can be selectively connected to different feed conduits G1 to G4 in a fluidic manner.

A gas distribution device, which is characterized in that gas outlet zones Z1 to Z4, Z9 to Z12 of a first group A, A' can be connected to a first feed conduit G1 by means of valves 20, and in that gas outlet zones Z3 to Z10 of a second group B can be connected to a second feed conduit G2 by means of valves 20, wherein at least a few of the gas outlet zones Z3, Z4, Z9, Z10 can be selectively connected to the first feed conduit G1 or the second feed conduit G2.

A gas distribution device, which is characterized in that two or more different gas outlet zones Z1 to Z12 can be selectively connected to one another in a fluidic manner.

A gas distribution device, which is characterized by mechanical switchover elements, by means of which an opening 19 of a supply conduit 18 or an opening 22, 22' between two or more gas outlet zones Z1 to Z12 can be selectively switched over between an opened or a closed position.

A gas distribution device, which is characterized in that at least five or at least eight or at least ten or at least twelve gas outlet zones Z1 to Z12 are provided.

A gas distribution device, which is characterized in that each of the gas outlet zones Z1 to Z12 has an individually assigned supply conduit 18, 18' and each supply conduit 18, 18' is connected to a gas conduit L1 to L12 of a gas mixing system, wherein at least a plurality of the supply conduits 18, 18' can be connected to one of multiple feed conduits G1 to G4 in a fluidic manner by means of multiple valves 20, and wherein each of the feed conduits G1 to G4 has a mass flow controller 27.

A gas distribution device, which is characterized in that the a pipe forming a supply conduit 18 can be displaced in a direction extending transverse to the plane of a base 14, 14' in such a way that a mouth 19 of the supply conduit 18 selectively opens into one of two gas distribution volumes 17, 17'.

A gas distribution device, which is characterized in that a pipe forming a supply conduit 18 has one or more openings 19 that lead into a gas distribution volume 17 and can be closed by rotating the pipe or an outer pipe 26, into which the pipe is inserted.

A gas distribution device, which is characterized in that an opening 22 in a base 14 between two gas distribution volumes 17, 17' can be selectively opened or closed by means of a closing element 25.

A gas distribution device, which is characterized in that supply conduits 18 and/or closing elements 25 can be locally displaced within the gas inlet device by means of mechanical switchover elements.

A method, which is characterized by the utilization of a gas distribution device according to one of the preceding claims, wherein the height of the gas inlet regions E1 to E5 is adjusted by interconnecting multiple gas outlet zones Z1 to Z12 that border on one another.

A CVD reactor, which is characterized in that a gas inlet device according to one of the preceding claims is arranged in the center of the process chamber 7, wherein the gas outlet walls 11 of the gas outlet zones Z1 to Z12, which are arranged on top of one another between the process chamber bottom and the process chamber ceiling, have gas outlet walls 11 that lie on a common cylinder shell surface.

An arrangement, which is characterized in that the gas mixing system has feed conduits G1 to G4 that are respectively connected to a source of a different process gas or a carrier gas, wherein multiple gas conduits L1 to L12 respectively feed one of the process gases or the carrier gas into a gas distribution volume 17 of a gas outlet zone Z1 to Z12, and wherein a plurality of the gas conduits L1 to L12 is respectively connected to a plurality of the feed conduits G1 to G4 in a fluidic manner by means of a valve 20 in such a way that different process gases or the carrier gas can be selectively fed into individual gas distribution volumes 17 by varying the position of the valves 20.

All disclosed characteristics are essential to the invention (individually, but also in combination with one another). The disclosure of the associated/attached priority documents (copy of the priority application) is hereby fully incorporated into the disclosure content of this application, namely also for the purpose of integrating characteristics of these documents into claims of the present application. The characteristics of the dependent claims also characterize independent inventive enhancements of the prior art without the characteristics of a claim to which they refer, particularly for submitting divisional applications on the basis of these claims. The invention specified in each claim may additionally comprise one or more of the characteristics that were disclosed in the preceding description and, in particular, are identified by reference symbols and/or included in the list of reference symbols. The invention also concerns design variations, in which individual characteristics cited in the preceding description are not realized, particularly as far as they are obviously dispensable for the respective intended use or can be replaced with other, identically acting technical means.

LIST OF REFERENCE SYMBOLS

1 Reactor housing
2 Susceptor
3 Heating apparatus
4 Substrate holder
5 Pocket
6 Shaft
7 Process chamber
8 Process chamber ceiling
9 Substrate
10 Gas inlet device
11 Gas outlet wall
12 Gas outlet opening
13 Bottom
14 Base
14' Base 15 Ceiling
16 Barrier
17 Gas distribution volume
17' Gas distribution volume
18 Supply conduit
18' Supply conduit
19 Mouth
20 Valve
21 Outlet opening
22 Opening
22' Opening
23 Bore
24 Stop
24' Stop
25 Closing element
25' Closing element
26 Outer pipe
27 Mass flow controller
A First group
A' First group
B Second group
E1-E5 Gas inlet regions
L1-L12 Gas conduits
G1-G4 Feed conduits
Z1-Z12 Gas outlet zones

What is claimed is:

1. A gas distribution device, comprising:
a plurality of gas inlet regions (E1 to E5), which are arranged on top of one another and from which process gases or a carrier gas are introduced into a process chamber (7) of a chemical vapor deposition (CVD) reactor;
a plurality of supply conduits (18);
at least five gas outlet zones (Z1 to Z12) that are arranged on top of one another and respectively have a gas distribution volume (17), into which one of the supply conduits (18) for introducing a gas flow leads, wherein adjacent gas distribution volumes (17, 17', 17") are separated from one another by a base (14), wherein each of the gas distribution volumes (17) has a gas outlet wall (11) with gas outlet openings (12), and wherein each of the gas inlet regions (E1 to E5) are formed by adjacent ones of the gas outlet walls (11); and
a matrix style gas mixing system comprising a plurality of gas conduits (L1 to L12) and a plurality of feed conduits (G1 to G4), wherein each of the supply conduits (18) is connected to one of the gas conduits (L1 to L12) of the matrix style gas mixing system, wherein each of the feed conduits (G1 to G4) is connected to a source of a process gas or an inert gas, wherein every one of the feed conduits (G1 to G4) intersects every one of the gas conduits (L1 to L12), and wherein at every intersection point between a respective one of the feed conduits (G1 to G4) and a respective one of the gas conduits (L1 to L12) a valve (20) is disposed.

2. The gas distribution device of claim 1, wherein the valves (20) are configured to connect a first group of the gas outlet zones (Z1, Z2, Z11, Z12) to a first one of the feed conduits (G1),
wherein the valves (20) are further configured to connect a second group of the gas outlet zones (Z5 to Z8) to a second one of the feed conduits (G2), and
wherein the valves (20) are further configured to connect a third group of the gas outlet zones (Z3, Z4, Z9, Z10) to either the first feed conduit (G1) or the second feed conduit (G2).

3. The gas distribution device of claim 1, wherein two of the gas outlet zones (Z1 to Z12) are fluidly connected to one another.

4. The gas distribution device of claim 1, further comprising a plurality of mass flow controllers (27), wherein a flow of each of the feed conduits (G1 to G4) is controlled by a respective one of the mass flow controllers (27).

5. A method for feeding process gases into a process chamber (7) of a chemical vapor deposition (CVD) reactor, the method comprising:
feeding, by the gas distribution device of claim 1, the process gases into the process chamber (7); and
adjusting respective heights of the gas inlet regions (E1 to E5) by fluidly connecting adjacent ones of the gas outlet zones (Z1 to Z12) with one another.

6. A chemical vapor deposition (CVD) reactor, comprising:
a process chamber (7) with a ceiling (8);
a susceptor (2) that is rotatable about a rotational axis and has pockets (5) that are open toward the process chamber (7);
a plurality of substrate holders (4) respectively arranged in each of said pockets, wherein the process chamber (7) extends between the susceptor (2) and the ceiling (8) of the process chamber (7); and
a gas distribution device of claim 1 arranged in a center of the process chamber (7).

* * * * *